United States Patent [19]
Kinoshita et al.

[11] Patent Number: 6,023,406
[45] Date of Patent: Feb. 8, 2000

[54] LC COMPOSITE COMPONENT WITH VARIABLE CAPACITOR AND INDUCTOR

[75] Inventors: Motohiro Kinoshita, Takefu; Hiroyuki Kishishita, Fukui-ken, both of Japan

[73] Assignee: Murata Manufacturing Co., Ltd., Nagaokakyo, Japan

[21] Appl. No.: 09/036,789

[22] Filed: Mar. 9, 1998

[30] Foreign Application Priority Data

Mar. 10, 1997 [JP] Japan .................................. 9-054327

[51] Int. Cl.⁷ .............................. H01G 5/00; H03H 7/00
[52] U.S. Cl. ..................... 361/277; 361/278; 333/185; 333/139; 333/174
[58] Field of Search ...................... 361/277, 278, 361/281, 283.2, 297, 299.2, 298.2, 298.5; 333/139, 159, 161, 174, 178–179, 185, 205, 235, 245, 246; 334/67, 79, 81, 82, 85

[56] References Cited

U.S. PATENT DOCUMENTS

| | | | |
|---|---|---|---|
| 3,702,958 | 11/1972 | Reynolds | 361/298.5 |
| 4,025,882 | 5/1977 | Takeo | 334/45 |
| 4,178,622 | 12/1979 | Oxley | 361/293 |
| 5,461,535 | 10/1995 | Kishishita et al. | 361/298.1 |
| 5,557,495 | 9/1996 | Belcher et al. | 361/298.2 |
| 5,867,360 | 2/1999 | Kishishita et al. | 361/292 |

*Primary Examiner*—Kristine Kincaid
*Assistant Examiner*—Anthony Dinkins
*Attorney, Agent, or Firm*—Burns, Doane, Swecker & Mathis, LLP

[57] ABSTRACT

An inductance/capacitance (LC) composite module with a built-in variable capacitor and coil is disclosed which includes a dielectric substrate having one principal surface on which a stator-side electrode is formed. Also formed thereon are a first terminal electrode connected to the stator-side electrode and a second terminal electrode independent of the first terminal electrode. The variable capacitor has a rotor of a chosen solid-state dielectric material in contact with the stator-side electrode. This rotor has thereon a rotor-side electrode which opposes the stator-side electrode with at least part of the rotor laid therebetween, thus forming an electrostatic capacitance. A rotatable support member is mounted so that it may rotate about the axis line at right angles to the substrate surface. The support member transmits its rotation to the rotor allowing the rotor to rotate with the support member. The support member has on its one end side an adjustment shape portion engageable with a hand tool for capacitance value adjustment. The coil is connected between the first and second terminal electrodes on the substrate. A shield cover is attached onto the substrate, which cover houses therein the rotor and support member as well as coil and has an opening for permitting access to the adjustment shape portion of the support member.

20 Claims, 6 Drawing Sheets

LC COMPOSITE COMPONENT WITH VARIABLE CAPACITOR AND INDUCTOR

The following application is based on Japanese Patent Application No. 9-54327, filed on Mar. 10, 1997, which is incorporated by reference in its entirety herein.

BACKGROUND OF THE INVENTION

1. Field of the Invention

The present invention relates generally to electronic devices with multiple electrical elements and, more particularly, to inductance/capacitance (LC) composite module components having therein a variable capacitor and an inductor.

2. Description of the Prior Art

Figure 8:
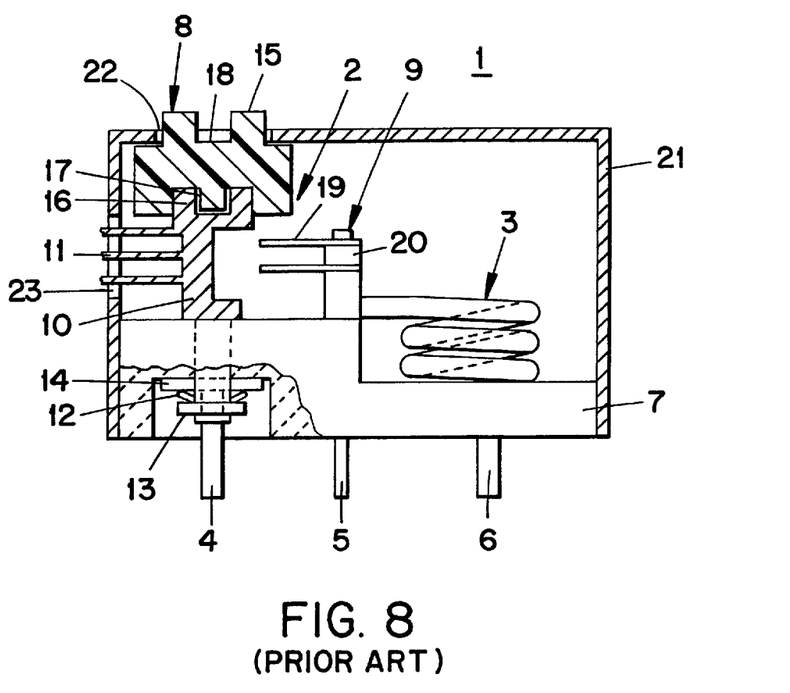
FIG. 8 shows an internal configuration of one prior known LC composite component with its substrate, rotor and shield cover illustrated in cross-section.
Figure 9:
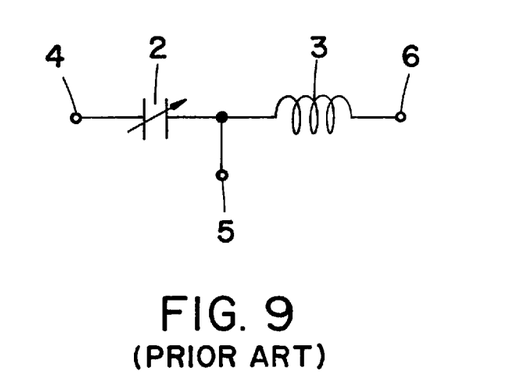
FIG. 9 is equivalent circuitry of the prior art LC composite component of FIG. 8.

One prior known LC composite component 1 is shown in FIG. 8. An equivalent electrical circuit of the LC composite component 1 of FIG. 8 is illustrated in FIG. 9. Such LC composite component 1 may be built in radio frequency (RF) modulators for use with video decks, television receivers and the like.

As shown in FIG. 8, the LC composite component 1 consists essentially of a serial combination of a variable capacitor 2 and a coil 3 acting as the inductor. This composite component also includes a first terminal 4 connected to one end of the variable capacitor 2, a second terminal 5 connected to a connection node between the other end of variable capacitor 2 and one end of the coil 3, and a third terminal 6 connected to the other end of coil 3.

As shown in FIG. 8, the LC composite component 1 has an electrically insulating substrate 7. The variable capacitor 2 provided in the LC composite component 1 employs air as the dielectric material thereof, which capacitor includes a rotor 8 and a stator 9 in a way such that the rotor 8 and stator 9 are supported by the substrate 7.

More specifically, the rotor 8 is generally made of a chosen metal and has a rotation shaft section 10 and a plurality of rotor-side electrodes 11 each formed into a semicircular shape, for example, which electrodes are thin plates which are laterally projected from the rotation shaft section 10. Such rotor 8 may typically be structured as an integral cutting-machined element. The rotation shaft section 10 penetrates the substrate 7. On the lower surface side of the substrate 7, a spring washer 12 and fastening or lock ring 13 are engaged on the rotation shaft section 10 for mechanical fixation or caulking of the lower edge part of rotation shaft section 10, thus allowing this shaft section 10 to be rotatably supported on substrate 7.

Additionally, a base 14 of the first terminal 4 is placed between the substrate 7 and spring washer 12, whereby the first terminal 4 is mechanically held with respect to substrate 7, while causing it to be electrically connected to the rotor 8.

Further, an adjustment shaft section 15 made of an electrically insulating material such as resin is engaged with the rotation shaft section 10 at the upper edge portion thereof. The rotation shaft section 10 is formed with a projection 16 for engagement, whereas the adjustment shaft section 15 is formed with an engagement recess 17 engageable with the engagement projection 16, thereby allowing the rotation shaft section 10 and adjustment shaft section 15 to rotate integrally. An adjustment groove 18 engageable with an adjustment hand tool such as a screw driver, for example is formed at the upper edge portion of the adjustment shaft section 15.

The stator 9 has a plurality of thin plate-shaped stator-side electrodes 19 and a spacer 20 inserted between these stator-side electrodes 19. The second terminal 5 is attached so that it penetrates the substrate 7 and further passes through the stator-side electrodes 19 and spacer 20 to be soldered together with these stator-side electrodes 19 and spacer 20, causing these parts to be rigidly mounted with respect to the terminal 5. The stator-side electrodes 19 are placed such that these are insertable into the inner space between the rotor-side electrodes 11 in accordance with rotation of the rotor 8 stated supra.

With the foregoing arrangement, the variable capacitor 2 is achieved. More specifically, the rotor-side electrodes 11 and stator-side electrodes 19 oppose each other with the air acting as the dielectric material, thus forming therebetween an intended electrostatic capacitance, which may be connected between the first and second terminals 4 and 5. Also, by rotating the adjustment shaft section 15 while letting an adjustment hand tool such as a screw driver be engaged with the adjustment groove 18 and then forcing the rotation shaft section 10 to likewise rotate, the rotor 8 is rotated, which changes or modifies the net overlapping or opposite area between the rotor-side electrodes 11 and stator-side electrodes 19, which in turn causes the resulting electrostatic capacitance to vary accordingly.

The coil 3 is of an air-core coil that has its one end soldered to the stator 9 and the other end penetrating the substrate 7 for constituting the third terminal discussed previously. In this way, the LC composite component 1 is obtained wherein the variable capacitor 2 and second terminal 5 are connected to the one end of the coil 3 with the third terminal 6 being coupled to the other end thereof as shown in FIG. 9.

Furthermore, a shield cover 21 is attached to the substrate 7 allowing the variable capacitor 2 and coil 3 to be housed therein. The shield cover 21 has an opening 22 for permitting exposure of the adjustment groove 18 of the adjustment shaft section 15. Upon attachment of the shield cover 21 on substrate 7, the adjustment shaft section 15 comes into engagement with shield cover 21 at the periphery of its opening 22, thus eliminating accidental detachment of it from the rotation shaft section 10.

Unfortunately, the above-mentioned LC composite component 1 presents several problems to be solved in relation to the variable capacitor 2 in particular.

First, since the variable capacitor 2 employs air as its dielectric material, it should be required that the rotor-side electrodes 11 and stator-side electrodes 19 be increased in area in order to obtain an electrostatic capacitance of a desired significance in value, which would result in an increase in the influence of inherent parasitic or stray capacitances therearound.

In addition, such LC composite component 1 is standardized pertinent to its outer size and layout of terminals 4–6, as well as positioning of the adjustment shaft section 15. Accordingly, in cases where the area of rotor-side electrodes 11 is simply expanded in the way discussed supra with the layout location of adjustment shaft section 15 being predefined in particular, it will possibly happen that the device design causes rotor-side electrodes 11 to extrude from the shield cover 21 at a specific rotation position. To avoid this, the shield cover 21 is provided with a window 23 for permitting such extrusion of rotor-side electrodes 11. This would result in a decrease in dust protectability and shield effect provided by the shield cover 21.

Further, the use of a cutting process for obtaining the rotation shaft section 10 with the rotor-side electrodes 11 and employment of a relatively large number of parts for obtaining the structure of stator-side electrodes 19 might negatively impact efforts to reduce cost. This problem will become more serious when the rotor-side electrodes 11 and stator-side electrodes 19 are increased in combination number in order to attain an increased electrostatic capacitance.

Furthermore, where the adjustment shaft 10 is inclined during capacitance adjustment, this causes the distance between the rotor-side electrodes 11 and stator-side electrodes 19 to change, letting the resultant capacitance likewise vary in value, which results in difficulty in achieving the intended adjustment.

Still further, since the rotor-side electrodes 11 and stator-side electrodes 19 are made of a thin plate shape, these elements remain readily vibratable upon application of vibration and mechanical shock thereto, which in turn renders variable the distance between the electrodes 19 and 20, whereby the resulting electrostatic capacitance might vary undesirably.

Yet further, the aforesaid vibration and shock can act to cause the rotor 8 and shield cover 21 to move unintentionally, thus rendering unstable the stray capacitance inherently formed between the rotor 8 and shield cover 21.

Moreover, since the rotor-side electrodes 11 and stator-side electrodes 19 are arranged in such a way that each of them acts as part of a corresponding one of the rotor 8 and stator 9 which are provided at separate locations on the substrate 7, the electrode-to-electrode distance between such rotor-side electrodes 11 and stator-side electrodes 19 remains variable significantly upon application of vibration and/or shock during assembly thereof, which is linked to the risk of unstable electrostatic capacitance. In the worst case, the rotor-side electrodes 11 can be brought into contact with stator-side electrodes 19 raising an electrical short-circuit state.

Additionally, since an electrical connection portion(s) must exist along the electrical conduction path leading from the rotor-side electrodes 11 up to first terminal 4 due to slidable contacts between the base 14 of the terminal 4 and either one of the rotation shaft section 10 and spring washer 12, electrical contact becomes unattainable or unreliable due to corrosion and/or contamination at such slidable contact portions. This would result in loss of intended functions of the variable capacitor 2 and also those of the LC composite component 1.

SUMMARY OF THE INVENTION

It is therefore an object of the present invention to provide an LC composite component capable of avoiding the problems associated with the prior art.

It is another object of the invention to provide an LC composite device structure capable of reducing complexity of fabrication while increasing reliability and stability of adjusted electrostatic capacitance.

To attain the foregoing objects, the instant invention provides a specific LC composite component with a variable capacitor and inductor, which offers several structural features which follow. The LC composite component includes an electrically insulating substrate. This substrate has its one principal surface on which a stator-side electrode is formed while also forming thereon a first terminal electrode electrically connected to the stator-side electrode and a second terminal electrode independent of the first terminal electrode.

A rotor made of a chosen solid-state dielectric material is disposed so that it is in contact with the stator-side electrode. This rotor supports thereon a rotor-side electrode. The rotor-side electrode opposes the stator-side electrode with at least part of the rotor being laid therebetween, thus forming an electrostatic capacitance.

A rotatable support member is also provided and supported in a way such that it may rotate about the axis line which crosses at right angles with the one principal surface of the substrate. The rotatable support member is an element that transmits its rotation to the rotor allowing this rotor to rotate together with the support member, the support member having on its one end side an adjustment shape portion engageable with a selected hand tool for adjustment.

An inductor is also provided which is connected between the above-mentioned first and second terminal electrodes as formed on the substrate.

Further provided on the substrate is a shield cover as attached thereto. This shield cover has an opening for permitting exposure of the adjustment shape portion of the rotatable support member and houses therein the rotor and rotatable support member, as well as inductor.

In the invention, the stator-side electrode may preferably be machined by mirror surface treatment, for example to have its surface roughness of less than or equal to about 1 $\mu$m.

In accordance with one aspect of the invention, the stator-side electrode is preferably such that it is configured from a first electrode section and a second electrode section which are independent of each other, causing the first electrode section to oppose the rotor-side electrode thereby defining a first electrostatic capacitance between them while allowing the second electrode section to oppose the rotor-side electrode forming therebetween a second electrostatic capacitance, the first electrostatic capacitance and second electrostatic capacitance being connected by the rotor electrode in series with each other. The above-described first terminal electrode is electrically connected to the first electrode section. Further formed on the substrate is a third terminal electrode electrically coupled to the second electrode section.

These and other objects, features and advantages of the invention will be apparent from the following more particular description of preferred embodiments of the invention, as illustrated in the accompanying drawings.

DETAILED DESCRIPTION OF THE INVENTION

Figure 1:
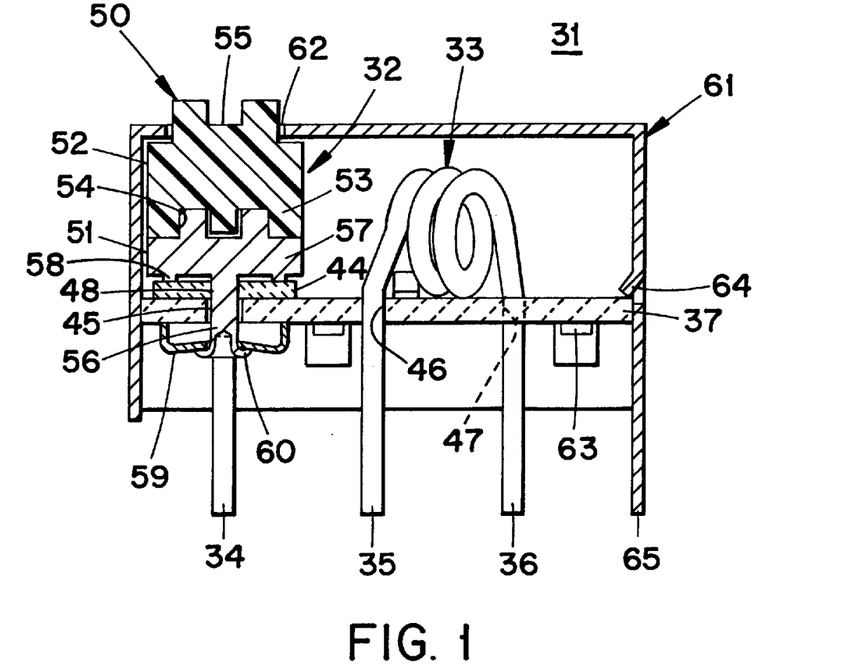
FIG. 1 is a diagram showing, partially in cross-section, an inside configuration of an LC composite component 31 in accordance with a first embodiment of the present invention with its front wall eliminated for purposes of illustration only.
Figure 2:
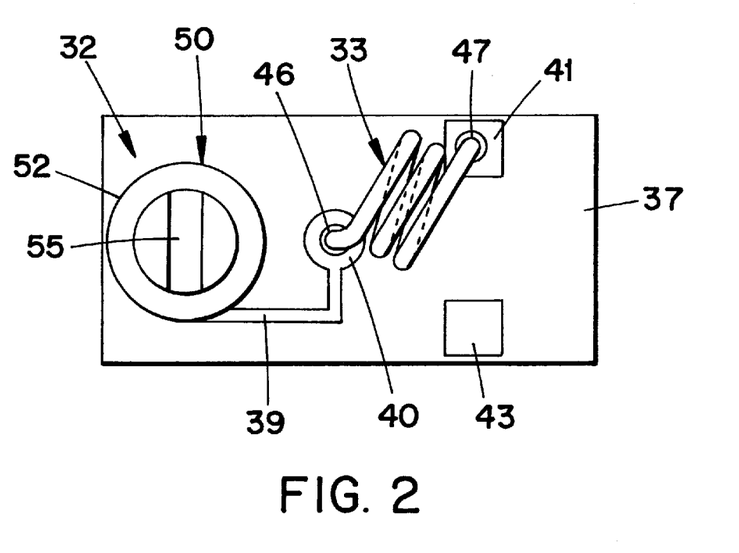
FIG. 2 is a diagram showing a plan view of the LC composite component of FIG. 1 with its shield cover eliminated for illustration purposes only.
Figure 3:
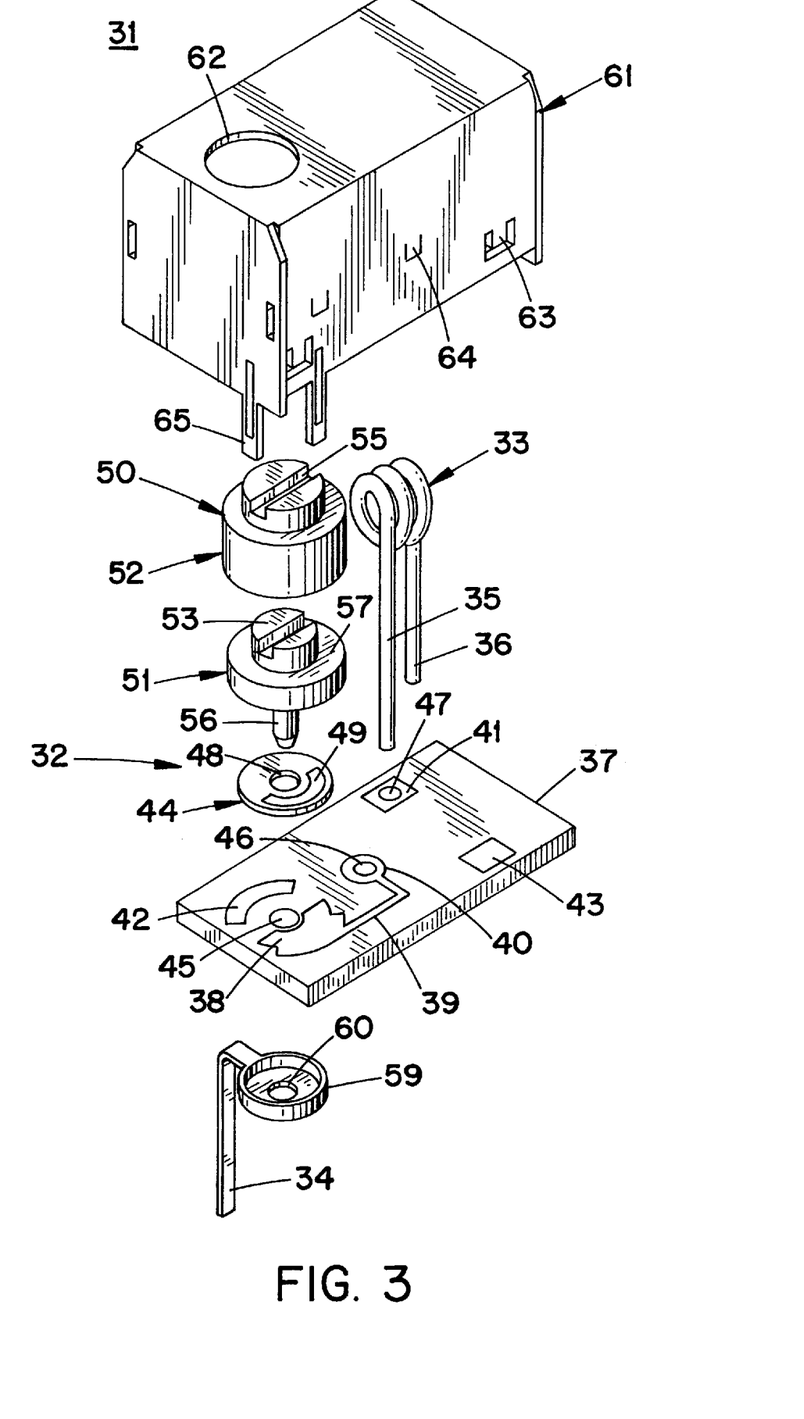
FIG. 3 shows an exploded view of the LC composite component of FIG. 1.

FIGS. 1 through 3 are for explanation of an LC composite component 31 in accordance with a first embodiment of this invention. Here, FIG. 1 illustrates in cross-section a front view of the LC composite component 31, FIG. 2 depicts a plan view of the LC composite component 31 for showing an internal configuration thereof, and FIG. 3 shows in a disassembled or "exploded" manner some major parts or elements of the LC composite component 31.

This LC composite component 31 provides electrical equivalent circuitry as discussed supra in conjunction with FIG. 9, including a variable capacitor 32 corresponding to the variable capacitor 2 shown in FIG. 9, a coil 33 corresponding to the coil 3, and first to third terminals 34, 35 and 36 equivalent to the first, second and third terminals 4, 5 and 6, respectively. Also, this LC composite component 31 is so designed as to enable the compatible use with the LC composite component 1 shown in FIG. 8.

The LC composite component 31 includes a substrate 37 made of a chosen electrically insulating or dielectric material such as alumina, for example. The substrate 37 has on its one principal surface a stator-side electrode 38 having an approximately semicircular shape. Also formed on the same principal substrate surface are a first terminal electrode 40 that is electrically connected via a lead electrode 39 to stator-side electrode 38, and a second terminal electrode 41 provided independently of the first terminal electrode 40. Further formed on this principal surface of substrate 37 are a dummy electrode 42 which is at a selected location that is opposite to the formation position of stator-side electrode 38, and a play or "idle" electrode 43 located at a position oppositely disposed from the second terminal electrode 41.

These electrodes 38 to 43 may be formed by deposition and backing treatment of a conductive paste onto the substrate 37, by way of example. After backing, the electrodes 38–43 are preferably subject to a mirror surface treatment in order to enhance their characteristics, such as the setting drift, Q characteristic, and the like. Additionally, the stator-side electrode 38 second terminal electrode 41, dummy electrode 42 and idle electrode 43 are made thick by twice coating of conductive paste or other equivalent techniques to thereby insure an appropriate grinding or polishing treatment of the stator-side electrode 38 and dummy electrode 42.

With regard to the mirror surface treatment of the stator-side electrode 38 and dummy electrode 42 in particular, this may preferably be carried out in a way such that the resulting surface roughness is less than or equal to about 1 $\mu$m, for example. Once stator-side electrode 38 and dummy electrode 42 are smoothed on the surface thereof in this way, it becomes possible for rotor 44 to rotate smoothly without having to add any lubricating oil between stator-side electrode 38 and dummy electrode 42 as well as a rotor 44 as will be later described. Standard variable capacitors have a problem caused by the additional application of lubrication oil between the stator-side electrode and rotor for achieving the rotor's smooth rotation, which undesirably affects the value of adjusted electrostatic capacitance, which, in turn, causes resultant electrostatic capacitance to increase undesirably. In the present embodiment, applying the mirror surface treatment to stator-side electrode 38 and dummy electrode 42 provides that their surface roughness is less than or equal to about 1 $\mu$m. This technique can therefore be used to avoid the use of such lubrication oil, enabling the resultant electrostatic capacitance value after adjustment to remain less changeable, thus advantageously serving to provide enhanced stability of the electrostatic capacitance as set by the variable capacitor 32.

The substrate 37 is provided with a bearing hole 45 that penetrates substrate 37 at a location between the stator-side electrode 38 and dummy electrode 42. The substrate also has through-going holes 46 and 47 within respective regions for formation of the first and second terminal electrodes 40 and 41.

A circular plate or disk-shaped rotor 44 is disposed so that it is in contact with the stator-side electrode 38 and dummy electrode 42 on the aforesaid substrate 37. The rotor 44 may be made of a solid-state dielectric material such as ceramic dielectric material. Rotor 44 may alternatively be made of other solid-state dielectric materials other than such ceramic dielectric material. A bearing hole 48 is centrally provided in rotor 44 for positional alignment with the bearing hole 45 of substrate 37.

A substantially semicircular rotor-side electrode 49 is formed on the upper principal surface of the rotor 44 in the state illustrated. The rotor-side electrode 49 opposes the stator-side electrode 38 with rotor 44 being laid between them. Rotor-side electrode 49 may typically be comprised of a conductive film as formed on the surface of rotor 44, although it may alternatively be of either a metal plate or metal foil separately prepared, which is then attached so that it is held on the surface of rotor 44. Still alternatively, the rotor may have a multilayer structure having the rotor-side electrode formed in the inside thereof. In the latter case, a large maximum electrostatic capacitance is obtainable while simultaneously retaining sufficient mechanical strength of the rotor due to the capability of causing the rotor-side electrode to oppose the stator-side electrode via part of the thickness of the rotor.

A rotatable support member 50 is provided which is rotatable about the center axis line that is at right angles to the upper principal surface of the substrate 37. The rotatable support member 50 consists generally of a rotation shaft section 51 and an adjustment shaft section 52 engageable with the upper end part of this rotation shaft section 51. Rotation shaft section 51 may be made of a conductive material such as metal whereas adjustment shaft section 52 is of an electrically insulating material.

The rotation shaft section 51 is formed with an engagement projection 53 whereas the adjustment shaft section 52 is formed with a corresponding engagement recess 54 that is engageable with the engagement projection 53, thereby permitting integral rotation of rotation shaft section 51 and adjustment shaft section 52.

Provided on the upper edge side of the adjustment shaft section 52 is an adjustment shape portion engageable with adjustment hand tools (not shown), such as screw drivers, which portion may be an adjustment groove 55, by way of example. Optionally, this adjustment shape portion may be designed to have any other appropriate shapes as desired.

The rotation shaft section 51 has a shaft 56 that defines an axis line of rotation. This shaft 56 penetrates both the bearing hole 48 of rotor 44 and the bearing hole 45 of substrate 37. Also, a projection 58 which is in contact partially with the rotor 44 and rotor-side electrode 49 is provided on the lower surface of a flange 57 as formed at the upper edge portion of rotation shaft section 51, whereby a gap is defined between the lower surface of flange 57 and the rotor-side electrode 49. Due to the presence of this gap, the lower surface of flange 57 may be prevented from undesirably functioning as a substantially equivalent electrode to the rotor-side electrode 49. Additionally, the rotation shaft section 51 is electrically connected via the projection 58 to the rotor-side electrode 49.

The first terminal 34 discussed supra is attached to the shaft 56 of rotation shaft section 51 penetrating the bearing hole 48 of rotor 44 and bearing hole 45 of substrate 37 in the manner as described above. As better depicted in FIG. 3, the first terminal 34 is provided at its base 59 with a dish-like shape having spring like properties. The first terminal 34 is attached in a way such that the lower end part of shaft 56 is fastened as shown in FIG. 1 in the state that the shaft 56 of rotation shaft section 51 is forced to penetrate a center hole 60 provided in the base 59 while at the same time causing this base 59 to be placed on the lower surface side of substrate 37.

The attachment of the first terminal 34 onto substrate 37 in the way stated above allows the base 59 to exhibit its spring action, enabling the rotor 44 to reliably retain its contact state with the stator-side electrode 38 on substrate 37 via the rotation shaft section 51. In addition, the aforesaid dummy electrode 42 formed on substrate 37 serves to absorb any possible step-like differences otherwise occurring due to formation of the stator-side electrode 38 in the contact region of rotor 44, thereby to prevent rotor 44 from inclining with respect to the principal surface of substrate 37.

The coil 33 constitutes the inductor. In this embodiment, the inductor may be structured from an air-core coil comprised of a conductive wire such as, but not limited to, a piano wire, iron wire, or copper wire. Note here that coil 33 may alternatively be configured using, other than the air-core coil, either a chip inductor or an inductor as formed by part of lead patterns on substrate 37. One end of the coil 33 is inserted into the through-going hole 46 from the upper side of substrate 37 so that it extends to the lower side of substrate 37. This one end is soldered to the first terminal electrode 40, thereby constituting the second terminal 35 stated supra. The remaining end of coil 33 is inserted into another through-going hole 47 from the upper side of substrate 37 so that it extends down to the lower side of substrate 37. This remaining end is soldered to the second terminal electrode 41, thereby constituting the third terminal 36 as mentioned previously. Depiction of solders per se used herein for such soldering is eliminated in the accompanying drawings.

It should be noted that the second and third terminals 35 and 36 may be constructed from separately prepared members rather than by use of the end portions of coil 33.

A shield cover 61 is mounted to the substrate 37 to thereby house or enclose therein the rotor 44, rotatable support member 50 and coil 33. The shield cover 61 has an opening 62 for exposure of the adjustment groove 55 of adjustment shaft section 52. However, in the illustrated exemplary embodiment, this shield cover 61 is not formed with any opening corresponding to the above-described window 23 shown in FIG. 8.

The shield cover 61 is for protection of the interior of the LC composite component 31 while attaining intended shielding effect, which cover may be made of a conductive material such as a metal plate, for example. Shield cover 61 has a plurality of bent pieces 63 and plural cut-and-raise pieces 64 integrally formed using part of the shield cover 61 to ensure that position determination or alignment of shield cover 61 relative to substrate 37 is attainable by placing or "clipping" the edges of substrate 37 between these bent pieces 63 and cut-and-raise pieces 64.

The shield cover 61 extends also at the lower side of substrate 37 causing the shaft 56 of rotation shaft section 51 and the like to be placed within a space as defined in its interior. Also formed is an earth terminal 65 that further extends in a downward direction from the lower edges of shield cover 61.

When the shield cover 61 is mounted onto substrate 37, the adjustment shaft section 52 comes into engagement with the peripheral edge portion of the opening 62 of shield cover 61 thereby reducing the possibility of its accidental detachment or slip-out from rotation shaft section 51.

The shield cover 61 may be made of metal and also of either a readily metalizable resin such as liquid crystal resin with metal plating of nickel or the like applied thereto, or a resin added with conductivity (e.g., added with conductive material).

The LC composite component 31 thus arranged provides the equivalent circuitry shown in FIG. 9, wherein an electrostatic capacitance formed by the variable capacitor 32 is connected between the first terminal 34 electrically connected via rotation shaft section 51 to rotor-side electrode 49 and the second terminal 35 as electrically coupled to stator-side electrode 38 through lead electrode 39 and first terminal electrode 40. The inductance formed by the coil 33, on the other hand, is connected between the second terminal 35 and third terminal 36.

The electrostatic capacitance formed by the variable capacitor 32 may vary in value with rotation of the adjustment shaft section 52. More precisely, when an adjustment hand tool such as a screw driver is engaged at its tip with the adjustment groove 55 for rotation of adjustment shaft section 52, the rotation shaft section 51 behaves to likewise rotate, forcing rotor 44 to rotate accordingly. When this is done, the overlap area between rotor-side electrode 49 and stator-side electrode 38 varies letting the resultant electrostatic capacitance change in value accordingly.

Figure 4:
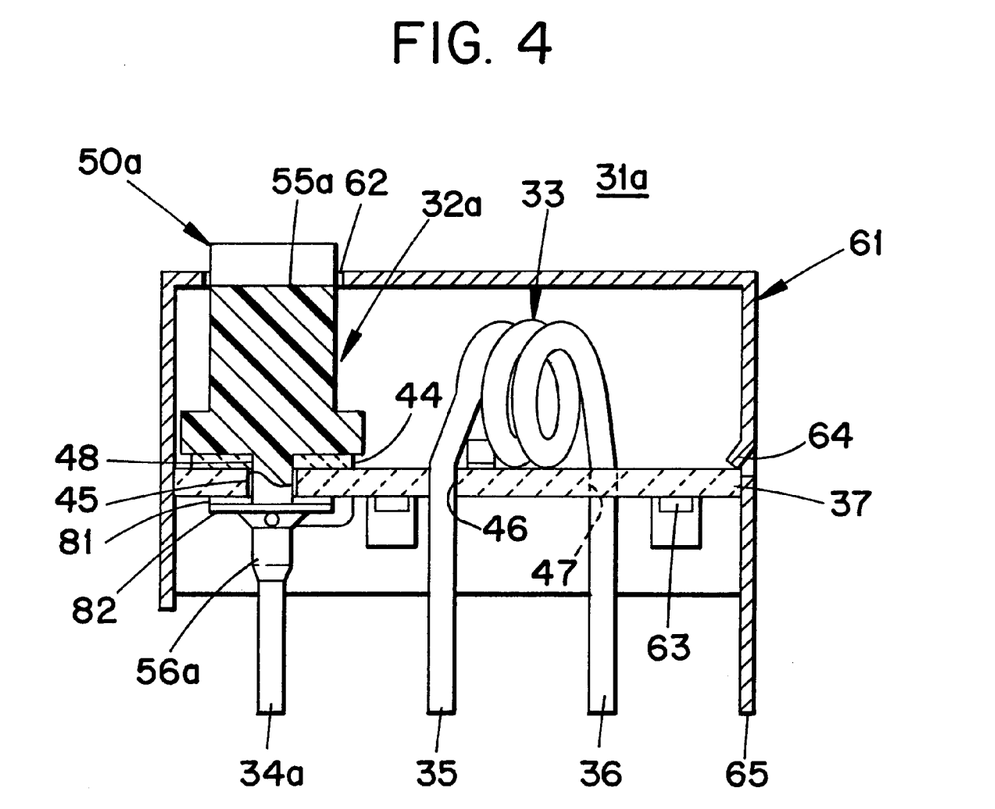
FIG. 4 illustrates, partially in cross-section, an internal configuration of an LC composite component in accordance with a second embodiment of the invention with its front wall eliminated.
Figure 5:
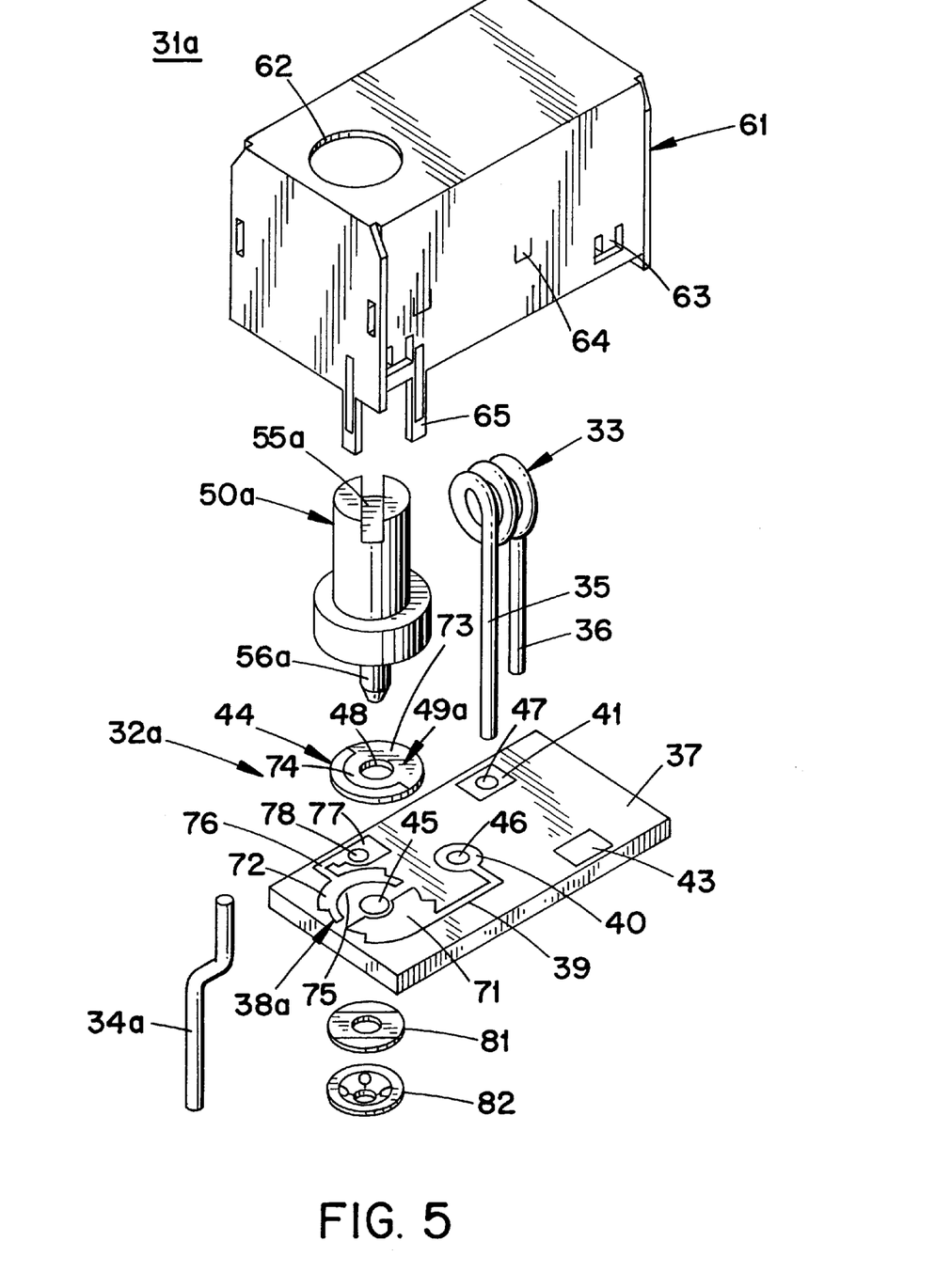
FIG. 5 is an exploded view of the LC composite component of FIG. 4.
Figure 6:
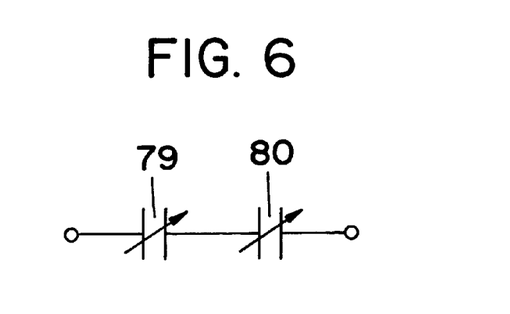
FIG. 6 depicts equivalent circuitry of a variable capacitor as arranged in the LC composite component of FIG. 4.

FIGS. 4 to 6 are for explanation of a second embodiment of the invention. Here, FIG. 4 is a depiction corresponding to FIG. 1 whereas FIG. 5 corresponds to FIG. 3. Additionally, FIG. 6 shows an equivalent circuit as provided by part of a variable capacitor 32a employed in an LC composite component 31a in accordance with the second embodiment. Note that like elements corresponding to those elements shown in FIGS. 1 and 3 are associated with like reference characters, and duplicate explanations will be eliminated herein for clarity purposes only.

This LC composite component 31a in accordance with the second embodiment is principally different from the earlier mentioned LC composite component 31 according to the first embodiment in the formation pattern of the conductive film on the substrate 37, shape of the rotor-side electrode 49a, configuration of a rotatable support member 50a, and the associated components relating thereto, as well as the configuration pertaining to a first terminal 34a.

An explanation will first be given of the conductive-film formation pattern on substrate 37 and the shape of rotor-side electrode 49a.

The stator-side electrode 38a formed on the upper principal surface of the substrate 37 consists essentially of first and second electrode sections 71 and 72 which are independent of each other. The first electrode section 71 is formed on one side of the bearing hole 45 whereas the second electrode section 72 is on the opposite side thereto. On the other hand, the rotor-side electrode 49a has a substantially semicircular main region 73 of relatively large diameter and an approximately semicircular subsidiary region 74 of smaller diameter, which regions are substantially concentric to each other and extend in opposite directions, with bearing hole 48 serving as the center.

More specifically, the first electrode section 71 is specifically designed to have a planar shape that may overlap almost the entire area of the main region 73 of rotor-side electrode 49a. The second electrode section 72 has a shape that may oppose the outer periphery of the main region 73 of rotor-side electrode 49a and yet has a cut-away portion 75 at a certain position that may oppose the subsidiary region 74.

Also on the substrate 37, the first electrode section 71 has a shape resembling that of the stator-side electrode 38 in the first embodiment stated supra, thus allowing the first terminal electrode 40 to be connected via lead electrode 39 thereto in a way similar to this stator-side electrode 38. On the other hand, a third terminal electrode 77 is formed which is connected via lead electrode 76 to second electrode section 72. A through-going hole 78 is provided in the region for formation of third terminal electrode 77.

The variable capacitor 32a thus configured using the stator-side electrode 38a and rotor-side electrode 49a provides an equivalent circuit shown in FIG. 6. To be more specific, the first electrode section 71 opposes rotor-side electrode 49a defining a first variable electrostatic capacitance 79 whereas second electrode section 72 and rotor-side electrode 49a oppose each other forming a second variable electrostatic capacitance 80, wherein the first electrostatic capacitance 79 and second electrostatic capacitance 80 are serially connected together by rotor-side electrode 49a, and wherein these series-combined first electrostatic capacitance 79 and second electrostatic capacitance 80 are connected via the first and third terminal electrodes 40 and 77.

The series electrostatic capacitance of the variable capacitor 32a as a whole is variable in value with a change in overlap area of first electrode section 71 and rotor-side electrode 49a and that of second electrode section 72 and rotor-side electrode 49a in accordance with the rotation of the rotor 44. In this embodiment, when the overlap area between first electrode section 71 and rotor-side electrode 49a decreases with rotation of rotor 44, the overlap area of second electrode section 72 and rotor-side electrode 49a increases; conversely, when the overlap area of the former increases, that of the latter decreases.

Preferably, the series electrostatic capacitance is designed so that its maximum value occurs once within the rotational range of the rotor 44. To this end, a certain device design is employed, causing rotor-side electrode 49a and first electrode section 71 to oppose each other with specified overlap area substantially equal to this maximum overlap area at an instant when rotor-side electrode 49a is identical in overlap area to second electrode section 72.

An explanation will next be given of a configuration of the rotatable support member 50a and its related arrangements.

In this second embodiment, the rotatable support member 50a has an integral structure. Preferably, rotatable support member 50a is integrally formed of an electrically insulating or dielectric material. Such dielectric material may be thermoplastic resin materials, such as polyamide-based resin, ploybthylene terphthalate, liquid crystal resin, polyphenylene sulfide or the like, or alternatively may be ceramic-based materials. Where such resin is to be used, certain resin with enhanced thermal deformation temperature characteristics may preferably be employed in order to provide guarantee of safety against possible heat application during soldering of LC composite component 31a and also for long-period use at high temperatures.

The rotatable support member 50a has its shaft 56a that penetrates a bearing hole 48 of rotor 44 and a bearing hole 45 of substrate 37, whereby the member is supported to be rotatable about an axis line perpendicular to the upper principal surface of substrate 37. An adjustment groove 55a is formed on the upper edge side of support member 50a.

The shaft 56a penetrates the bearing hole 48 of rotor 44 and the bearing hole 45 of substrate 37. The lower end of the shaft is first mated with a spring washer 81 and then a push nut 82. When mated, the push nut 82 bites into (e.g., squeezes) the shaft 56a to prevent accidental slippage of the shaft 56 with respect to the push nut 82.

In this way the shaft 56a is rigidly held so that it does not readily slip out of the bearing holes 48 and 45; under such condition, the spring washer 81 acts to compress or exert spring-like face on the push nut 82, forcing it to extend from substrate 37, thus enabling rotor 44 to be reliably placed in contact with stator-side electrode 38a via rotatable support member 50a.

Next, the first terminal 34a will be discussed. As best illustrated in FIG. 5, this first terminal 34a is provided by a wire which is bent into an "N"-like shape. The first terminal 34a is inserted from the underside of the substrate 37 into the through-going hole 78 within the region where the aforesaid third terminal electrode 77 is formed, and is then soldered to the third terminal electrode 77.

The remaining configuration of the second embodiment may be substantially the same as that of the first embodiment, and an explanation thereof is eliminated herein.

With the second embodiment, the stator-side electrode 38a formed on the substrate 37 is subdivided into first and second electrode sections 71 and 72 which are designed to oppose the rotor-side electrode 49a, defining first and second electrostatic capacitances 79 and 80 respectively, which are series-connected by rotor-side electrode 49a, thereby making it possible for this series electrostatic capacitance to be connected to only the side of stator-side electrode 38a. Accordingly, it may be no longer necessary to form the electrical conductive path for connecting the electrostatic capacitance as a movable element such as rotor 44, thus increasing reliability of the variable capacitor 32a, and, in turn, that of the LC composite component 31a per se.

It should be noted that the arrangement of subdividing the stator-side electrode 38a into first and second electrode sections 71 and 72 with the rotor-side electrode 49a opposed to common first and second electrode sections 71 and 72 defining the first and second electrostatic capacitances 79 and 80, respectively, which are then combined by rotor-side electrode 49a into a series connection, may alternatively be attainable by use of a stator-side electrode and rotor-side electrode of other patterns.

Figure 7:
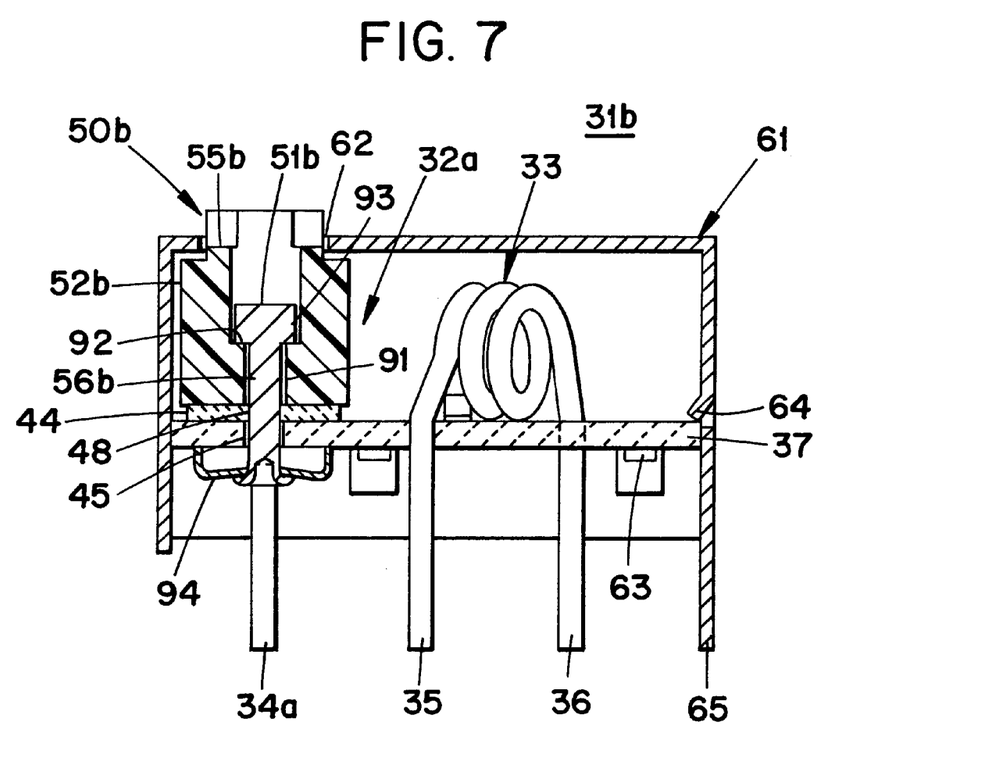
FIG. 7 shows, partially in cross-section, an inside configuration of an LC composite component in accordance with a third embodiment of the invention.

FIG. 7 is for explanation of a third embodiment of the invention, which may correspond to FIG. 1 or FIG. 4. As shown, an LC composite component 31b as depicted therein is substantially the same as the LC composite component 31a shown in FIG. 4 in the formation pattern of a conductive film on the substrate 37 and shape of rotor-side electrode 49a, as well as the arrangement concerning first terminal 34a. A principal difference of this LC composite component 31b over the remaining illustrative embodiments is a configuration of its rotatable support member 50b and its arrangement of the related elements associated therewith.

The rotatable support member 50b has a rotation shaft section 51b and adjustment shaft section 52b. The rotation shaft section 51b may be made of a machinable material such as metal, for example, whereas adjustment shaft section 52b is preferably made of a dielectric material such as resin.

The adjustment shaft section 52b is formed on its upper edge side with an adjustment groove 55b. Adjustment shaft section 52b is also formed with a through-going hole 91 on the center line axis thereof, which hole 91 has a stair-step portion 92 as formed at its intermediate part in the axis line direction thereof. Further, rotation shaft section 51b is inserted into the through-going hole 91 from its upper side, causing the head section 93 thereof to be engaged with the upper face of step portion 92.

It should be noted in this embodiment that integral rotatability of the rotation shaft section 51b and adjustment shaft section 52b is not essential and that the adjustment shaft section 52b alone is configured rotatably, while arranging rotation shaft section 51b so that it provides a mere support shaft for rotation of adjustment shaft section 52b and rotor 44, as will be described in detail below.

The rotation shaft section 51b has a shaft 56b for defining the axis line of rotation, which shaft 56b extends through both the bearing hole 48 of rotor 44 and the bearing hole 45 of substrate 37. Also, a dish-like spring washer 94 with spring action is attached to the shaft 56b that has penetrated such bearing holes 48 and 45, which shaft 56b is then self-locked or caulked at the lower end thereof.

Such attachment of the spring washer 94 may permit activation of its spring force enabling rotor 44 to be reliably contacted with the stator-side electrode 38a (see FIG. 5) on substrate 37 via rotation shaft section 51b and adjustment shaft section 52b. This rigid contact state is retained between adjustment shaft section 52b and rotor 44 to ensure that when adjustment shaft section 52b is rotated the rotor 44 rotates accordingly.

With this third embodiment, the caulking technique is employed for attachment of rotatable support member 50b onto substrate 37 so that the high temperature resistivity and mechanical strength or robustness may be enhanced as compared to the second embodiment stated supra.

The remaining arrangement of the third embodiment is substantially the same as that of the second embodiment, and like elements equivalent to those shown in FIG. 4 are associated with like reference characters, with redundant explanations being eliminated herein.

It is to noted in the third embodiment that where the adjustment shaft section 52b is made of metal, an appropriate projection corresponding to the projection 58 discussed supra may preferably be provided on the lower surface thereof in a way such that this projection is partially placed in contact with the rotor 44 and/or rotor-side electrode 49a (see FIG. 5).

As apparent from the foregoing description, with the LC composite components embodying the invention, use of the rotor made of solid-state dielectric materials rather than air as the dielectric material for the variable capacitor may increase the relative dielectric constant thereof, providing any intended electrostatic capacitance of desired significance, which, in turn, advantageously serves to avoid the necessity of excessively increasing the area of the rotor-side electrode and that of the stator-side electrode, thus enabling a decrease in the degree to which it is affected by its ambient stray capacitance as inherently present therearound.

Another advantage of the invention lies in the fact that the capability of reducing the size or down-sizing of the variable capacitor part may avoid the need to additionally provide a window in the shield cover for elimination of interference with either the rotor-side electrode or the rotor of the LC composite component thus arranged. Accordingly, the dust protectability and shield effect will no longer decrease.

Yet another advantage of the invention lies in the capability of producing and assembling manufacturing parts or elements of the LC composite component by currently available fabrication technology. Also, the invention enables the parts cost and the number of assembly processing steps to decrease when compared to the prior art LC composite component shown in FIG. 8, with assembly of these parts being made much easier, which in turn leads to a decrease in production costs.

Further, the invention may overcome almost all of the problems encountered with the prior art LC composite component 1 shown in FIG. 8, including adjustment difficulty due to a capacitance variation resulting from a change in distance between the rotor-side electrode 11 and stator-side electrode 19 when adjustment shaft 10 tilts or inclines during capacitance adjustment, causing undesirable variations of the electrostatic capacitance due to a deviation of the distance between electrodes 11 and 19. The present invention also avoids the problems caused by the inherent vibratory nature of rotor-side electrode 11 and stator-side electrode 19, which are comprised of thin plates, upon application of vibrations and/or physical shocks thereto, instability of a stray capacitance as defined between rotor 8 and shield cover 21 due to accidental movement of rotor 8 and shield cover 21 by such vibrations or shocks applied thereto, and instability of electrostatic capacitance or in the worst case, unwanted occurrence of electrical short-circuit by a contact between rotor-side electrode 11 and stator-side electrode 19 due to possibility that the inter-electrode distance between rotor-side electrode 11 and stator-side electrode 19 might vary significantly during assembly or upon application of vibrations and shocks thereto because of the fact that rotor-side electrode 11 and stator-side electrode 19 are independently provided at separate locations on substrate 7, wherein each of the electrodes is formed as an integral part of a corresponding one of the rotor 8 and stator 9 associated therewith.

In this embodiment, where the stator-side electrode is specifically designed so that its surface roughness is less than or equal to 1 $\mu$m, it becomes possible for the rotor to be smoothly rotatable without having to add any lubricating oil between the stator-side electrode and rotor. As a consequence, the problem of an increase in electrostatic capacitance caused by such oil after adjustment of the electrostatic capacitance may be avoided, enabling the resultant electrostatic capacitance as provided by the variable capacitor to be more stable.

Furthermore, in the invention, since the stator-side electrode consists essentially of the first and second electrode sections independent of each other, allowing the first electrode section to oppose the rotor-side electrode forming the first electrostatic capacitance while simultaneously causing the second electrode section to oppose the rotor-side electrode defining the second electrostatic capacitance with such first and second electrostatic capacitances being coupled in series to each other by the rotor-side electrode, the necessity of additionally forming an exclusive electrical conduction path for connection of resultant electrostatic capacitance may be avoided, enhancing reliability of the LC composite component.

Although the invention has been disclosed and illustrated with reference to a particular embodiment, the principles involved can be used in numerous other embodiments which will be apparent to persons skilled in the art. The invention is, therefore, to be limited only as indicated by the scope of the appended claims.

What is claimed is:

1. An LC composite component with a variable capacitor and an inductor, said component comprising:

an electrically insulating substrate having a principal surface on which a stator-side electrode is formed, and having formed thereon a first terminal electrode electrically connected to said stator-side electrode and a second terminal electrode independent of said first terminal electrode;

a rotor made of a solid-state dielectric material disposed in contact with said stator-side electrode;

a rotor-side electrode supported by said rotor which opposes said stator-side electrode with at least part of said rotor being laid between said stator-side and rotor-side electrodes, thereby forming an electrostatic capacitance;

a rotatable support member rotatably secured about an axis line crossing at approximately right angles with the principal surface of said substrate for transmitting its rotation to said rotor, thus making said rotor rotate together therewith, said support member having on its one end side a shape portion for adjustment which is engageable with an adjustment tool;

an inductor connected between said first and second terminal electrodes; and a shield cover having an opening for permitting exposure of the adjustment shape portion of said rotatable support member and being attached to said substrate, while housing therein said rotor and said rotatable support member as well as said inductor.

2. The LC composite component according to claim 1, wherein said stator-side electrode has a surface roughness of less than or equal to about 1 micrometer ($\mu$m).

3. The LC composite component according to claim 1, wherein said stator-side electrode comprises a first electrode section and a second electrode section which are independent of each other, said first electrode section and said rotor-side electrode being oppositely disposed from each other defining a first electrostatic capacitance between them while causing said second electrode section and said rotor-side electrode to oppose each other forming a second electrostatic capacitance therebetween, with said first electrostatic capacitance and said second electrostatic capacitance being serially connected together by said rotor-side electrode, said first terminal electrode being electrically connected to said first electrode section, and a third terminal electrode being further formed on said substrate and electrically connected to said second electrode section.

4. The LC composite component according to claim 2, wherein said stator-side electrode comprises a first electrode section and a second electrode section which are independent of each other, said first electrode section and said rotor-side electrode being oppositely disposed from each other defining a first electrostatic capacitance between them while causing said second electrode section and said rotor-side electrode to oppose each other forming a second electrostatic capacitance therebetween, with said first electrostatic capacitance and said second electrostatic capacitance being serially connected together by said rotor-side electrode, said first terminal electrode being electrically connected to said first electrode section, and a third terminal electrode being further formed on said substrate and electrically connected to said second electrode section.

5. An LC composite component with a variable capacitor and an inductor, said component comprising:

an insulating substrate having a first surface and a second surface, wherein a stator-side electrode is formed on said first surface;

a rotor made of an insulating material having a rotor-side electrode disposed thereon, wherein said rotor-side electrode is at least partially disposed opposite to said stator-side electrode with said insulating material of said rotor disposed therebetween, thereby forming an electrostatic capacitance;

a rotatable support member for rotating said rotor, thereby changing a position of said rotor-side electrode with respect to said stator-side electrode, which, in turn, changes a value of said electrostatic capacitance; and wherein said inductor is electrically connected to said stator electrode.

6. The LC composite component according to claim 5, further including a first and second terminal electrodes disposed on said first substrate surface, wherein said first terminal electrode is connected to said stator-side electrode, further wherein said first terminal electrode is connected to a first end of said inductor, and said second terminal electrode is connected to a second end of said inductor.

7. The LC composite electrode according to claim 5, further including a dummy electrode disposed on said first surface of the substrate disposed opposite to said stator electrode.

8. The LC composite electrode according to claim 5, wherein said stator-side electrode comprises a first electrode section and a second electrode section independent of each other, said first electrode section and said rotor-side electrode being oppositely disposed from each other and defining a first electrostatic capacitance between them, and wherein said second electrode section and said rotor-side electrode oppose each other and form a second electrostatic capacitance.

9. The LC composite component according to claim 8, wherein said first and second electrostatic capacitances are serially connected to each other.

10. The LC composite component according to claim 8, wherein said rotor-side electrode comprises a semicircular main region portion and an oppositely disposed semicircular subsidiary region portion.

11. The LC composite component according to claim 8, further including a first, second and third terminal electrodes disposed on said first substrate surface, wherein said first terminal electrode is connected to said first electrode section, said third terminal electrode is connected to said second electrode section, and wherein said first terminal electrode is connected to a first end of said inductor, and said second terminal electrode is connected to a second end of said inductor.

12. The LC composite component according to claim 5, wherein said stator-side electrode has a surface roughness of less than or equal to about 1 micrometer ($\mu$m).

13. The LC composite component according to claim 5, wherein said rotatable support member comprises a shaft extending therefrom which passes through a through-hole in said substrate.

14. The LC composite component according to claim 13, wherein said shaft also extends through a through-hole formed in said rotor.

15. The LC composite component according to claim 13, wherein shaft is connected to a rotation shaft section, which, in turn, is connected to an adjustment shaft section.

16. The LC composite component according to claim 13, wherein said rotatable support member has an integral structure.

17. The LC composite component according to claim 13, wherein said shaft is received in an adjustment shaft section, wherein said adjustment shaft section rotates independent of said shaft, which is fixed.

18. The LC composite component according to claim 15, wherein said rotation shaft section is made of a conductive material and said adjustment shaft section is made of an insulating material.

19. The LC composite component according to 13, wherein a lower end portion of the shaft is connected to a first terminal via a base section, where said base section exerts a spring-like force, said spring-like force compressing said rotor against said stator-side electrode.

20. A variable capacitor for use in an LC composite component, comprising:

an insulating substrate having a first surface and a second surface, wherein a stator-side electrode is formed on said first surface;

a rotor made of an insulating material having a rotor-side electrode disposed thereon, wherein said rotor-side electrode is at least partially disposed opposite to said stator-side electrode with said insulating material of said rotor disposed therebetween, thereby forming an electrostatic capacitance; and a rotatable support member for rotating said rotor, thereby changing a position of said rotor-side electrode with respect to said stator-side electrode, which, in turn, changes a value of said electrostatic capacitance.

* * * * *